(12) United States Patent
Kim et al.

(10) Patent No.: US 12,166,578 B2
(45) Date of Patent: **\*Dec. 10, 2024**

(54) PRIORITY BASED MAPPING OF ENCODED BITS TO SYMBOLS

(71) Applicant: QUALCOMM Incorporated, San Diego, CA (US)

(72) Inventors: Hobin Kim, San Diego, CA (US); Hari Sankar, San Diego, CA (US); Alexei Yurievitch Gorokhov, San Diego, CA (US); Michael Lee Mccloud, San Diego, CA (US); Joseph Binamira Soriaga, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/657,938

(22) Filed: Apr. 4, 2022

(65) Prior Publication Data

US 2022/0231787 A1    Jul. 21, 2022

Related U.S. Application Data

(63) Continuation of application No. 15/963,474, filed on Apr. 26, 2018, now Pat. No. 11,296,823.

(Continued)

(51) Int. Cl.
*H04L 1/00* (2006.01)
*H03M 13/11* (2006.01)
*H04W 28/04* (2009.01)

(52) U.S. Cl.
CPC ....... *H04L 1/0058* (2013.01); *H03M 13/1102* (2013.01); *H04L 1/0041* (2013.01); *H04L 1/0071* (2013.01); *H04W 28/04* (2013.01)

(58) Field of Classification Search
None
See application file for complete search history.

(56) References Cited

U.S. PATENT DOCUMENTS

| 7,280,606 B2 | 10/2007 | Kim et al. |
| 8,379,738 B2 | 2/2013 | Pi et al. |

(Continued)

FOREIGN PATENT DOCUMENTS

| CN | 1898891 A | 1/2007 |
| CN | 101150550 A | 3/2008 |

(Continued)

OTHER PUBLICATIONS

Cheng T., et al., "A Near-Capacity MIMO Coded Modulation Scheme for Digital Terrestrial Television Broadcasting", IEEE Transactions on Broadcasting, vol. 61, No. 3, Sep. 1, 2015 (Sep. 1, 2015), XP055335748, pp. 367-375.

(Continued)

*Primary Examiner* — Steve N Nguyen
(74) *Attorney, Agent, or Firm* — Guang Yu Zhang; ArentFox Schiff LLP

(57) ABSTRACT

A new radio (NR) bit prioritization procedure that may be executed by a UE and a base station is disclosed, resulting in transmission and reception of modulation symbols having prioritized bits. For example, a transmitter may encode a code block using low-density parity-check code to generate a stream of encoded bits. The transmitter may arrange the encoded bits in one or more modulation symbols according to a relative priority of the encoded bits. The highest priority bits may be located in the most significant bits of the modulation symbol, and therefore be less likely to experience errors. A receiver may receive the modulation symbols and reorder the encoded bits according to the coding scheme based on the relative priority prior to decoding the encoded bits. The prioritization of the bits within the modulation (Continued)

symbols may provide improved block error rates over sequential mapping of encoded bits to symbols.

19 Claims, 8 Drawing Sheets

Related U.S. Application Data

(60) Provisional application No. 62/512,464, filed on May 30, 2017.

(56) References Cited

U.S. PATENT DOCUMENTS

| | | | |
|---|---|---|---|
| 9,461,863 | B2 | 10/2016 | Vojcic et al. |
| 11,296,823 | B2 | 4/2022 | Kim et al. |
| 2003/0120995 | A1 | 6/2003 | Kim et al. |
| 2004/0062318 | A1 | 4/2004 | Yu et al. |
| 2005/0152408 | A1* | 7/2005 | Jeong ............... H03M 13/1148 370/529 |
| 2005/0216821 | A1* | 9/2005 | Harada ............... H03M 13/1102 714/801 |
| 2007/0079213 | A1* | 4/2007 | Ismail ............... H03M 13/1148 714/758 |
| 2007/0180345 | A1* | 8/2007 | Ismail ............... H03M 13/1148 714/752 |
| 2007/0283216 | A1* | 12/2007 | Kyung ............... H03M 13/11 714/758 |
| 2008/0049857 | A1 | 2/2008 | Walton et al. |
| 2008/0049859 | A1 | 2/2008 | Choi et al. |
| 2008/0279303 | A1 | 11/2008 | Wengerter et al. |
| 2009/0063929 | A1* | 3/2009 | Jeong ............... H03M 13/1165 714/752 |
| 2009/0122903 | A1* | 5/2009 | Miyazaki ............... H03M 13/11 375/286 |
| 2009/0125781 | A1* | 5/2009 | Jeong ............... H03M 13/11 714/752 |
| 2009/0138785 | A1* | 5/2009 | Sakai ............... H03M 13/1102 714/790 |
| 2009/0290544 | A1* | 11/2009 | Yano ............... H03M 13/6393 370/329 |
| 2010/0027704 | A1 | 2/2010 | Ho et al. |
| 2010/0162073 | A1* | 6/2010 | Myung ............... H03M 13/1102 714/752 |
| 2010/0202386 | A1 | 8/2010 | Takaoka et al. |
| 2011/0161772 | A1* | 6/2011 | Yoshii ............... H03M 13/1102 714/752 |
| 2012/0051460 | A1* | 3/2012 | Jeong ............... H03M 13/1165 375/298 |
| 2012/0134423 | A1 | 5/2012 | Zhou et al. |
| 2012/0154532 | A1 | 6/2012 | Faraj et al. |
| 2016/0308557 | A1* | 10/2016 | Raimondi ......... H03M 13/2792 |
| 2017/0201344 | A1* | 7/2017 | Lim ............... H04L 1/0009 |

FOREIGN PATENT DOCUMENTS

| | | |
|---|---|---|
| CN | 101529737 A | 9/2009 |
| CN | 102957498 A | 3/2013 |
| CN | 103181085 A | 6/2013 |
| WO | 2009028886 A2 | 3/2009 |

OTHER PUBLICATIONS

Fowdur T.P., et al., "Performance of IEEE 802.11n LDPC Codes with Modified Reliability Based Hybrid ARQ and Unequal Error Protection", IEEE EUROCON 2015—International Conference on Computer as a Tool (EUROCON), IEEE, Sep. 8, 2015 (Sep. 8, 2015), XP032803187, DOI: 10.1109/EUROCON.2015.7313674, [retrieved on Oct. 30, 2015], abstract, pp. 1-6.

Gong L., et al., "Improve the Performance of LDPC Coded QAM by Selective Bit Mapping in Terrestrial Broadcasting System", IEEE Transactions on Broadcasting, IEEE Service Center, Piscataway, NJ, US, vol. 57, No. 2, Jun. 1, 2011 (Jun. 1, 2011), XP011476790, pp. 263-269.

International Search Report and Written Opinion—PCT/US2018/029980—ISA/EPO—Jul. 30, 2018.

* cited by examiner

FIG. 2

PRIORITY BASED MAPPING OF ENCODED BITS TO SYMBOLS

CROSS-REFERENCE TO RELATED APPLICATIONS

This Application is a continuation of U.S. patent application Ser. No. 15/963,474 titled "PRIORITY BASED MAPPING OF ENCODED BITS TO SYMBOLS," filed Apr. 26, 2018, which claims the benefit of U.S. Provisional Application No. 62/512,464, titled "PRIORITY BASED MAPPING OF ENCODED BITS TO SYMBOLS," filed May 30, 2017, which is assigned to the assignee hereof, and incorporated herein by reference in its entirety.

BACKGROUND

Aspects of the present disclosure relate generally to wireless communication networks, and more particularly, to transmission coding.

Wireless communication networks are widely deployed to provide various types of communication content such as voice, video, packet data, messaging, broadcast, and so on. These systems may be multiple-access systems capable of supporting communication with multiple users by sharing the available system resources (e.g., time, frequency, and power). Examples of such multiple-access systems include code-division multiple access (CDMA) systems, time-division multiple access (TDMA) systems, frequency-division multiple access (FDMA) systems, orthogonal frequency-division multiple access (OFDMA) systems, and single-carrier frequency division multiple access (SC-FDMA) systems.

These multiple access technologies have been adopted in various telecommunication standards to provide a common protocol that enables different wireless devices to communicate on a municipal, national, regional, and even global level. For example, a fifth generation (5G) wireless communications technology (which can be referred to as new radio (NR)) is envisaged to expand and support diverse usage scenarios and applications with respect to current mobile network generations. In an aspect, 5G communications technology can include: enhanced mobile broadband addressing human-centric use cases for access to multimedia content, services and data; ultra-reliable-low latency communications (URLLC) with certain specifications for latency and reliability; and massive machine type communications, which can allow a very large number of connected devices and transmission of a relatively low volume of non-delay-sensitive information. As the demand for mobile broadband access continues to increase, however, further improvements in NR communications technology and beyond may be desired.

For example, for NR communications technology and beyond, conventional transmission coding solutions may not provide a desired level of speed or customization for efficient operation. Thus, improvements in wireless communication operations may be desired.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect, the present disclosure provides a method of wireless communications including transmitting prioritized bits within one or more modulation symbols. The method may include encoding a code block using a low-density parity-check (LDPC) code to generate a stream of encoded bits including systematic bits and parity bits. The method may include determining a degree of each of the systematic bits and parity bits. The method may include determining a relative priority of each encoded bit based on the degree of each systematic bit and parity bit. The method may include arranging the encoded bits in one or more modulation symbols according to the relative priority of each encoded bit. The method may include transmitting the one or more modulation symbols.

In another aspect, the present disclosure provides an apparatus for wireless communications including transmitting prioritized bits within one or more modulation symbols. The apparatus may include a memory and a processor in communication with the memory. The processor may be configured to encode a code block using a LDPC code to generate a stream of encoded bits including systematic bits and parity bits. The processor may be configured to determine a degree of each of the systematic bits and parity bits. The processor may be configured to determine a relative priority of each encoded bit based on the degree of the systematic bits and parity bits. The processor may be configured to arrange the encoded bits in one or more modulation symbols according to the relative priority of each encoded bit. The processor may be configured to transmit the one or more modulation symbols.

In another aspect, present disclosure provides an apparatus for wireless communications including transmitting prioritized bits within one or more modulation symbols. The apparatus may include means for encoding a code block using a LDPC code to generate a stream of encoded bits. The apparatus may include means for determining a degree of each of the systematic bits and parity bits. The apparatus may include means for determining a relative priority of the systematic bits and the parity bits based on the degree of each systematic bit and parity bit. The apparatus may include means for arranging the encoded bits in one or more modulation symbols according to the relative priority of each encoded bit. The apparatus may include means for transmitting the one or more modulation symbols.

In another aspect, present disclosure provides computer-readable medium storing computer code executable by a processor for wireless communication. The computer-readable medium may include code executable to encode a code block using a LDPC code to generate a stream of encoded bits including systematic bits and parity bits. The computer-readable medium may include code executable to determine a degree of each of the systematic bits and parity bits. The computer-readable medium may include code executable to determine a relative priority of each encoded bit based on the degree of each systematic bit and parity bit. The computer-readable medium may include code executable to arrange the encoded bits in one or more modulation symbols according to the relative priority of each encoded bit. The computer-readable medium may include code executable to transmit the one or more modulation symbols. The computer-readable medium may be a non-transitory computer-readable medium.

In another aspect, the present disclosure provides a method of wireless communications including receiving prioritized bits within modulation symbols. The method may include receiving at least one modulation symbol representing encoded bits. A most significant bit of the modulation symbol has a higher priority under a specified coding scheme than a least significant bit of the modulation symbol. The method may include reordering the encoded bits according to the specified coding scheme based on the relative priority. The method may include decoding the reordered bits.

Moreover, the present disclosure also includes apparatuses having components configured to execute or means for executing the above-described methods, and computer-readable medium storing one or more codes executable by a processor to perform the above-described methods.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which:

FIG. 2 is an example of a signal constellation using 256-QAM modulation;

DETAILED DESCRIPTION

Figure 1:
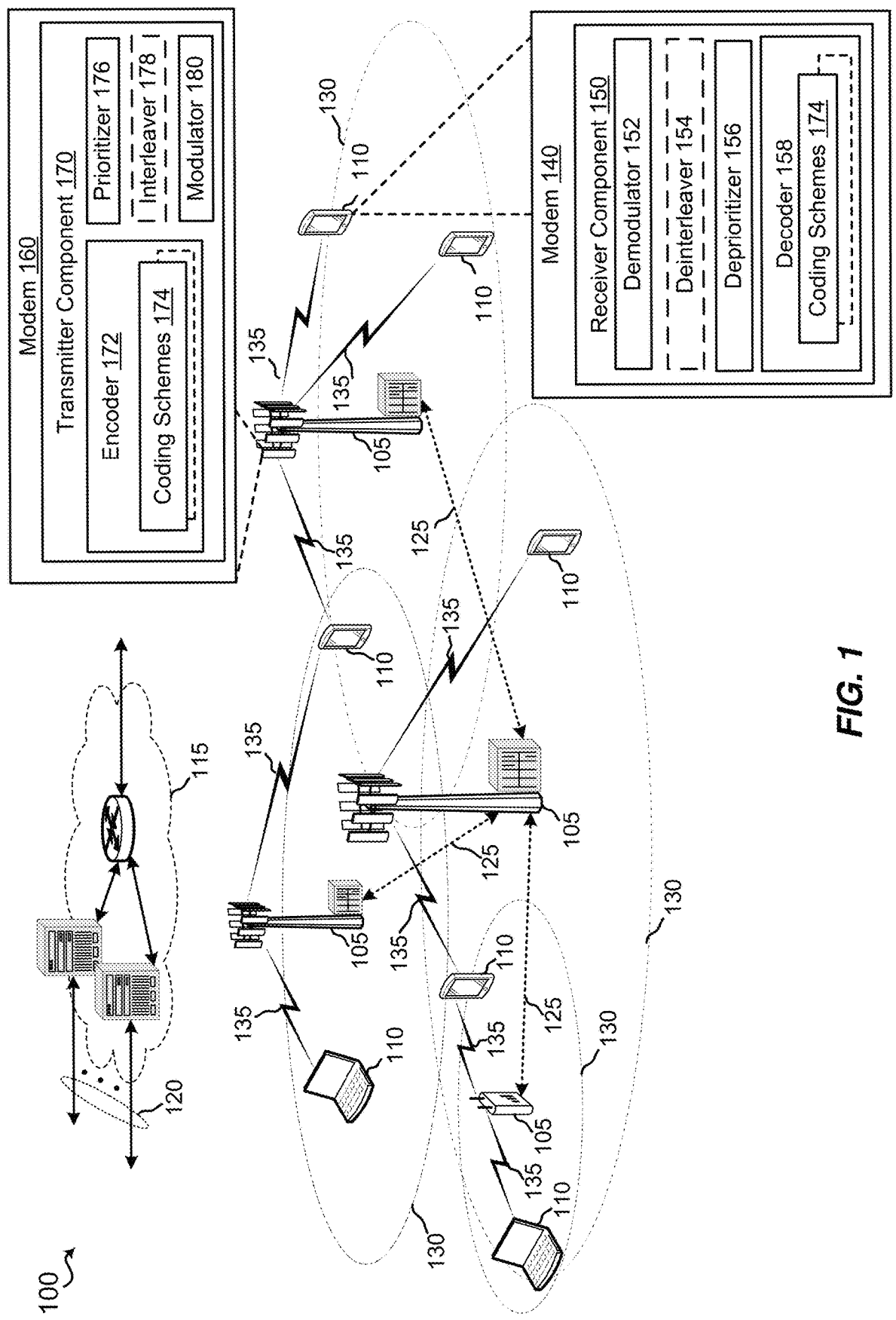
FIG. 1 is a schematic diagram of an example wireless communication network including at least one user equipment (UE) having a physical layer component configured according to this disclosure to arrange encoded bits in one or more symbols according to a relative priority.

Various aspects are now described with reference to the drawings. In the following description, for purposes of explanation, numerous specific details are set forth in order to provide a thorough understanding of one or more aspects. It may be evident, however, that such aspect(s) may be practiced without these specific details. Additionally, the term "component" as used herein may be one of the parts that make up a system, may be hardware, firmware, and/or software stored on a computer-readable medium, and may be divided into other components.

The present disclosure generally relates to techniques for transmitting prioritized encoded bits within one or more modulation symbols. In wireless communications, systematic coding is used to provide for error correction. A code block (e.g., a block of data having a particular size) is systematically encoded to produce a stream of systematic bits and parity bits. The systematic bits may be decoded to obtain the original code block. In order to transmit the encoded bits, the encoded bits are mapped into one or more modulation symbols, which are transmitted over the air and may experience interference before being received by a receiver. The receiver then attempts to decode the code block based on the bits in the received modulation symbols, which may have errors due to the interference. If the receiver is unable to decode the code block using the systematic bits, the parity bits may be used to correct errors and decode the code block.

Higher order modulation schemes may be used to transmit multiple bits within a single modulation symbol. For example, quadrature phase shift keying (QPSK) and quadrature amplitude modulation (QAM) transmit multiple bits per symbol. LTE utilizes 16-QAM, which transmits 4 bits per symbol and 64-QAM, which transmits 6 bits per symbol. 5G (NR) may allow use of 256-QAM (8 bits), 512-QAM (9 bits), or even higher orders. Although QAM modulation schemes are described as examples, the techniques disclosed herein may be used with other higher order modulation schemes. In such higher order modulation schemes, the probability that the most significant bit (MSB) is changed due to interference is significantly lower than the probability that the least significant bit (LSB) is changed due to interference. For example, as long as the receiver detects the correct quadrant for the symbol, the MSB may be correct, even if the LSB has been changed due to interference.

Existing systems (e.g., LTE) use a sequential mapping of encoded bits into each modulation symbol. For example, the stream of bits may sequentially fill the bits of a first symbol, then a second symbol, and so on until each bit is assigned to a location in a symbol. The encoded bits may also be interleaved to provide diversity. In either case, the encoded bits are essentially placed randomly or arbitrarily into the one or more modulation symbols. According to the present disclosure, it may be possible to have additional gain by assigning high priority encoded bits to the MSB, which can have higher reliability than the LSB, in higher order modulation.

The present disclosure provides techniques for arranging encoded bits within one or more modulation symbols according to the relative priority of the bits. Generally, systematic bits have a higher priority than parity bits because a code block can be decoded based on only the systematic bits. Some encoding schemes (e.g., LDCP) produce varying degrees of systematic and parity bits. Higher degree systematic and parity bits may have higher priority than lower degree systematic and parity bits. The higher priority bits may be mapped to more significant locations within the modulation symbols. Accordingly, the receiver may be more likely to receive the correct values of the higher priority (e.g., systematic) bits and decode the code block.

Additional features of the present aspects are described in more detail below with respect to FIGS. 1-8.

It should be noted that the techniques described herein may be used for various wireless communication networks such as CDMA, TDMA, FDMA, OFDMA, SC-FDMA, and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases 0 and A are commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM). An OFDMA system may implement a radio technology such as Ultra Mobile Broadband (UMB), Evolved UTRA (E-UTRA), IEEE 802.11 (Wi-Fi), IEEE 802.16 (WiMAX), IEEE 802.20, Flash-OFDM™, etc. UTRA and E-UTRA are part of Universal Mobile Telecommunication System (UMTS). 3GPP Long Term Evolution (LTE) and LTE-Advanced (LTE-A) are new releases of UMTS that use E-UTRA. UTRA, E-UTRA, UMTS, LTE, LTE-A, and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies, including cellular (e.g., LTE) communications over a shared radio frequency spectrum band. The description below, however, describes an LTE/LTE-A system for purposes of example, and LTE terminology is used in much of the description below, although the techniques are applicable beyond LTE/LTE-A applications (e.g., to 5G networks or other next generation communication systems).

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in other examples.

Referring to FIG. 1, in accordance with various aspects of the present disclosure, an example wireless communication network 100 includes at least one UE 110 with a modem 140 having a receiver component 150 that decodes received symbols based on a relative priority of encoded bits. Further, wireless communication network 100 includes at least one base station 105 with a modem 160 having a transmitter component 170 that transmits symbols including encoded bits according to a relative priority of the encoded bits. Additionally, although FIG. 1 illustrates components for a downlink communication from the base station 105 to the UE 110, both the base station 105 and the UE 110 may include both the transmitter component 170 and the receiver component 150. Accordingly, both the base station 105 and the UE 110 may perform priority based mapping of encoded bits to symbols. The priority based mapping may be used for downlink communications, uplink communications, and/or device to device communications. Thus, according to the present disclosure, the base station 105 and/or the UE 110 may transmit and/or receive communications having encoded bits mapped to modulation symbols based on a relative priority of the encoded bits.

The wireless communication network 100 may include one or more base stations 105, one or more UEs 110, and a core network 115. The core network 115 may provide user authentication, access authorization, tracking, internet protocol (IP) connectivity, and other access, routing, or mobility functions. The base stations 105 may interface with the core network 115 through backhaul links 120 (e.g., S1, etc.). The base stations 105 may perform radio configuration and scheduling for communication with the UEs 110, or may operate under the control of a base station controller (not shown). In various examples, the base stations 105 may communicate, either directly or indirectly (e.g., through core network 115), with one another over backhaul links 125 (e.g., X1, etc.), which may be wired or wireless communication links.

The base stations 105 may wirelessly communicate with the UEs 110 via one or more base station antennas. Each of the base stations 105 may provide communication coverage for a respective geographic coverage area 130. In some examples, base stations 105 may be referred to as a base transceiver station, a radio base station, an access point, an access node, a radio transceiver, a NodeB, eNodeB (eNB), gNB, Home NodeB, a Home eNodeB, a relay, or some other suitable terminology. The geographic coverage area 130 for a base station 105 may be divided into sectors or cells making up only a portion of the coverage area (not shown). The wireless communication network 100 may include base stations 105 of different types (e.g., macro base stations or small cell base stations, described below). Additionally, the plurality of base stations 105 may operate according to different ones of a plurality of communication technologies (e.g., 5G (New Radio or "NR"), fourth generation (4G)/LTE, 3G, Wi-Fi, Bluetooth, etc.), and thus there may be overlapping geographic coverage areas 130 for different communication technologies.

In some examples, the wireless communication network 100 may be or include one or any combination of communication technologies, including a NR or 5G technology, a Long Term Evolution (LTE) or LTE-Advanced (LTE-A) or MuLTEfire technology, a Wi-Fi technology, a Bluetooth technology, or any other long or short range wireless communication technology. In LTE/LTE-A/MuLTEfire networks, the term evolved node B (eNB) may be generally used to describe the base stations 105, while the term UE may be generally used to describe the UEs 110. The wireless communication network 100 may be a heterogeneous technology network in which different types of eNBs provide coverage for various geographical regions. For example, each eNB or base station 105 may provide communication coverage for a macro cell, a small cell, or other types of cell. The term "cell" is a 3GPP term that can be used to describe a base station, a carrier or component carrier associated with a base station, or a coverage area (e.g., sector, etc.) of a carrier or base station, depending on context.

A macro cell may generally cover a relatively large geographic area (e.g., several kilometers in radius) and may allow unrestricted access by UEs 110 with service subscriptions with the network provider.

A small cell may include a relative lower transmit-powered base station, as compared with a macro cell, that may operate in the same or different frequency bands (e.g., licensed, unlicensed, etc.) as macro cells. Small cells may include pico cells, femto cells, and micro cells according to various examples. A pico cell, for example, may cover a small geographic area and may allow unrestricted access by UEs 110 with service subscriptions with the network provider. A femto cell may also cover a small geographic area (e.g., a home) and may provide restricted access and/or unrestricted access by UEs 110 having an association with the femto cell (e.g., in the restricted access case, UEs 110 in a closed subscriber group (CSG) of the base station 105, which may include UEs 110 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The communication networks that may accommodate some of the various disclosed examples may be packet-based networks that operate according to a layered protocol stack and data in the user plane may be based on the IP. A user plane protocol stack (e.g., packet data convergence protocol (PDCP), radio link control (RLC), MAC, etc.), may perform packet segmentation and reassembly to communicate over logical channels. For example, a MAC layer may perform priority handling and multiplexing of logical channels into transport channels. The MAC layer may also use hybrid automatic repeat/request (HARQ) to provide retransmission at the MAC layer to improve link efficiency. In the control plane, the RRC protocol layer may provide establishment, configuration, and maintenance of an RRC connection between a UE 110 and the base stations 105. The RRC protocol layer may also be used for core network 115 support of radio bearers for the user plane data. At the physical (PHY) layer, the transport channels may be mapped to physical channels. In an aspect, the mapping may include arranging encoded bits within modulation symbols based on the relative priority of the encoded bits.

The UEs 110 may be dispersed throughout the wireless communication network 100, and each UE 110 may be stationary or mobile. A UE 110 may also include or be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 110 may be a cellular phone, a smart phone, a personal digital assistant (PDA), a wireless modem, a wireless communication device, a handheld device, a tablet computer, a laptop computer, a cordless phone, a smart watch, a wireless local loop (WLL) station, an entertainment device, a vehicular component, a customer premises equipment (CPE), or any device capable of communicating in wireless communication network 100. Additionally, a UE 110 may be Internet of Things (IoT) and/or machine-to-machine (M2M) type of device, e.g., a low power, low data rate (relative to a wireless phone, for example) type of device, that may in some aspects communicate infrequently with wireless communication network 100 or other UEs. A UE 110 may be able to communicate with various types of base stations 105 and network equipment including macro eNB s, small cell eNB s, macro gNBs, small cell gNBs, relay base stations, and the like.

A UE 110 may be configured to establish one or more wireless communication links 135 with one or more base stations 105. The wireless communication links 135 shown in wireless communication network 100 may carry uplink (UL) transmissions from a UE 110 to a base station 105, or downlink (DL) transmissions, from a base station 105 to a UE 110. The downlink transmissions may also be called forward link transmissions while the uplink transmissions may also be called reverse link transmissions. Each wireless communication link 135 may include one or more carriers, where each carrier may be a signal made up of multiple sub-carriers (e.g., waveform signals of different frequencies) modulated according to the various radio technologies described above. Each modulated signal may be sent on a different sub-carrier and may carry control information (e.g., reference signals, control channels, etc.), overhead information, user data, etc. In an aspect, the wireless communication links 135 may transmit bidirectional communications using frequency division duplex (FDD) (e.g., using paired spectrum resources) or time division duplex (TDD) operation (e.g., using unpaired spectrum resources). Frame structures may be defined for FDD (e.g., frame structure type 1) and TDD (e.g., frame structure type 2). Moreover, in some aspects, the wireless communication links 135 may represent one or more broadcast channels.

In some aspects of the wireless communication network 100, base stations 105 or UEs 110 may include multiple antennas for employing antenna diversity schemes to improve communication quality and reliability between base stations 105 and UEs 110. Additionally or alternatively, base stations 105 or UEs 110 may employ multiple input multiple output (MIMO) techniques that may take advantage of multi-path environments to transmit multiple spatial layers carrying the same or different coded data.

Wireless communication network 100 may support operation on multiple cells or carriers, a feature which may be referred to as carrier aggregation (CA) or multi-carrier operation. A carrier may also be referred to as a component carrier (CC), a layer, a channel, etc. The terms "carrier," "component carrier," "cell," and "channel" may be used interchangeably herein. A UE 110 may be configured with multiple downlink CCs and one or more uplink CCs for carrier aggregation. Carrier aggregation may be used with both FDD and TDD component carriers. The base stations 105 and UEs 110 may use spectrum up to Y MHz (e.g., Y=5, 10, 15, or 20 MHz) bandwidth per carrier allocated in a carrier aggregation of up to a total of Yx MHz (x=number of component carriers) used for transmission in each direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

The wireless communication network 100 may further include base stations 105 operating according to Wi-Fi technology, e.g., Wi-Fi access points, in communication with UEs 110 operating according to Wi-Fi technology, e.g., Wi-Fi stations (STAs) via communication links in an unlicensed frequency spectrum (e.g., 5 GHz). When communicating in an unlicensed frequency spectrum, the STAs and AP may perform a clear channel assessment (CCA) or listen before talk (LBT) procedure prior to communicating in order to determine whether the channel is available.

Additionally, one or more of base stations 105 and/or UEs 110 may operate according to a NR or 5G technology referred to as millimeter wave (mmW or mmwave) technology. For example, mmW technology includes transmissions in mmW frequencies and/or near mmW frequencies. Extremely high frequency (EHF) is part of the radio frequency (RF) in the electromagnetic spectrum. EHF has a range of 30 GHz to 300 GHz and a wavelength between 1 millimeter and 10 millimeters. Radio waves in this band may be referred to as a millimeter wave. Near mmW may extend down to a frequency of 3 GHz with a wavelength of 100 millimeters. For example, the super high frequency (SHF) band extends between 3 GHz and 30 GHz, and may also be referred to as centimeter wave. Communications using the mmW and/or near mmW radio frequency band has extremely high path loss and a short range. As such, base stations 105 and/or UEs 110 operating according to the mmW technology may utilize beamforming in their transmissions to compensate for the extremely high path loss and short range.

The transmitter component 170 may transmit modulation symbols including a plurality of encoded bits arranged according to a relative priority of the encoded bits. A modulation symbol may be a signal constellation representing the values of the plurality of bits. In particular, the modulation symbol may be a higher order modulation symbol representing at least 4 bits. Examples of higher order modulation schemes include 64-QAM, 128-QAM, 256-QAM, and 512-QAM, although other modulation schemes may also utilize higher order modulation symbols. In a higher order modulation symbol, the MSB may have a lower probability of error than less significant bits. In an aspect, the ordinal significance of the bit correlates with the ordinal likelihood that the bit will be correctly received. The transmitter component 170 may map encoded bits to the modulation symbols based on the relative priority of the encoded bits. The transmitter component 170 may include an encoder 172 for encoding a code block according to a coding scheme 174 selected from one or more configured coding schemes to generate a stream of encoded bits, a prioritizer 176 for reordering the stream of encoded bits based on priority, an interleaver 178 for reordering bits for diversity, and a modulator 180 for generating modulation symbols based on the encoded bits.

The encoder 172 may encode a code block to generate a stream of encoded bits based on a coding scheme 174. The encoder 172 may select one coding scheme from one or more configured systematic coding schemes such as low-density parity-check (LDPC) codes. The encoder 172 may also select a coding rate of the selected coding scheme based on channel conditions and/or higher layer signaling. The encoder 172 may receive a code block as an input and generate a stream of encoded bits. A code block may be a number of bits based on the selected coding scheme and coding rate. For example, the code block may be a minimum of bits that the encoder 172 encodes for a given coding scheme and coding rate. The code block may be generated by one or more logical channels that are mapped to physical channels. The stream of bits may include different types of bits based on the coding scheme 174. For example, LDPC codes may produce systematic bits and two or more degrees of parity bits. The encoder 172 may output the encoded bit stream in a defined order. For example, the encoder 172 may output all of the systematic bits for a code block followed by all of the parity bits.

The prioritizer 176 may reorder the bit stream based on the relative priority of the encoded bits. For example, the prioritizer 176 may reorder the bit stream such that all of the systematic bits are grouped together and all of the parity bits are grouped together. In an aspect, the prioritizer 176 may determine the priority of the encoded bits according to the coding scheme 174 and the coding rate. In an aspect, the prioritizer 176 may use a look-up table that maps the output of the coding scheme 174 according to a priority of each bit. The prioritizer 176 may reorder the bits based on the priority. In another aspect, the prioritizer 176 may use a formula that maps an output of the coding scheme 174 to a location within a group of modulation symbols. For example, the formula may map an $i^{th}$ output bit ($b_i$) based on the number of symbols ($N_{sym}$) and number of bits per symbol ($N_{bits}$). For example, formula (1) may be used to map bits to the most significant bit available across $N_{sym}$ symbols. Formula 1:

$$b_i \rightarrow (i \bmod N_{sym})*N_{bits}+i/N_{sym} \quad (1)$$

For a coding scheme 174 that outputs the highest priority bits (e.g., systematic bits) first, formula 1 may map the highest priority bits to the most significant bits of each symbol. More complex formulas may be used for coding schemes that sequentially output bits of different priority. A coding scheme may be analyzed using simulation and/or extrinsic information transfer (EXIT) charts to determine the output location of the priority bits.

The interleaver 178 may interleave the encoded bits in order to provide signal diversity against burst errors. In an aspect, the interleaver 178 may operate at a bit, symbol, or sub-carrier level. The interleaver 178 may be integrated with the prioritizer 176 or perform a separate interleaving operation. For example, bit level interleaving may be integrated with prioritization to maintain the priority of the interleaved bits. As another example, symbol level interleaving may be performed after the prioritization without affecting the prioritization of the bits within the symbols.

Figure 2:
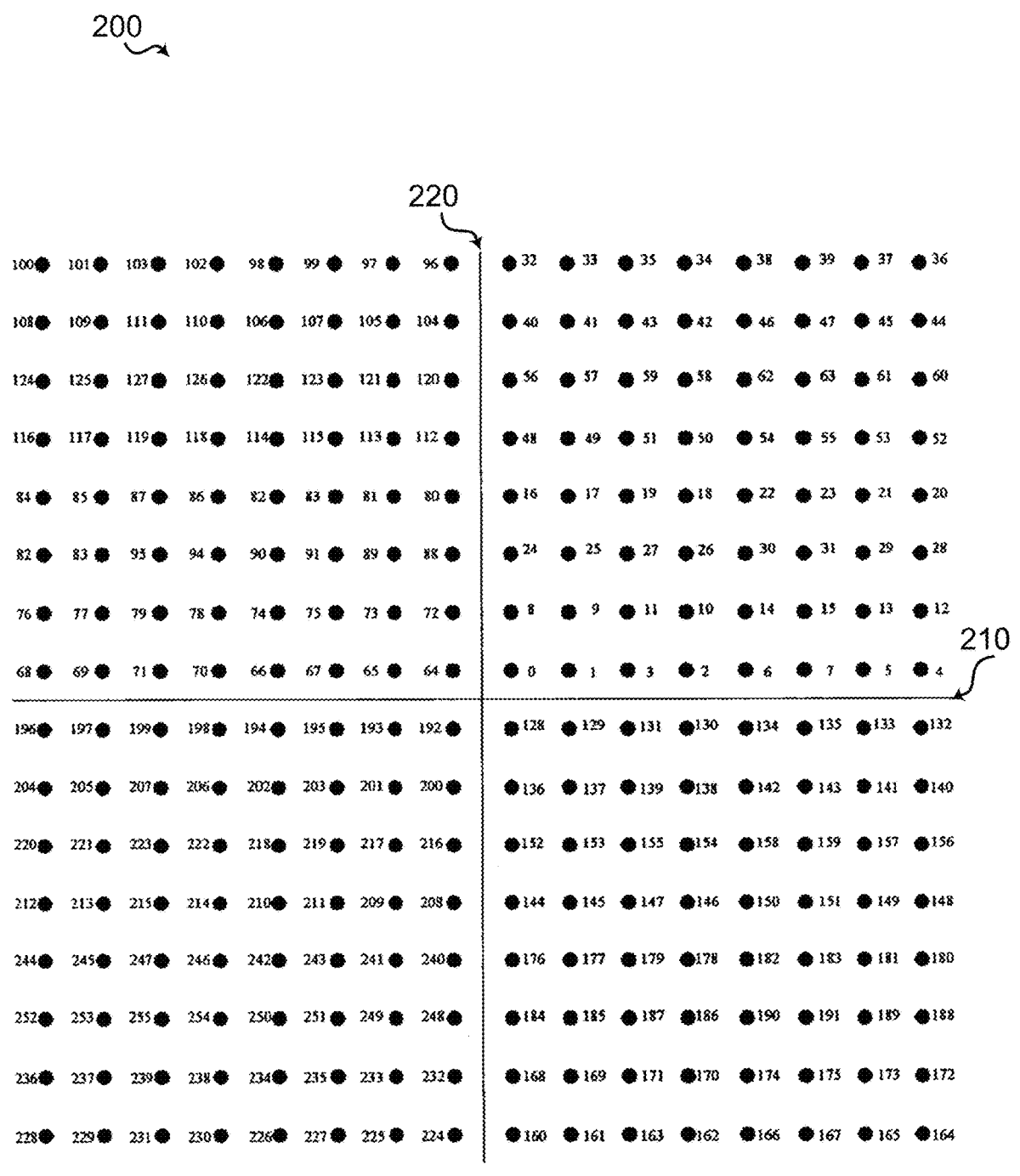

The modulator 180 may receive a stream of encoded bits and generate modulation symbols based on a modulation scheme. For example, 256-QAM may generate a modulation symbol from 8 bits or 512-QAM may generate a modulation symbol from 10 bits. FIG. 2, discussed in further detail below, illustrates an example signal constellation 200 for 256-QAM. The modulator 180 may provide the modulation symbols for transmission.

The receiver component 150 may receive modulation symbols that have been transmitted by the transmitter component 170. The receiver component 150 may perform the inverse operations of the transmitter component 170 in order to obtain a stream of encoded bits and then decode the encoded bits to obtain the original code block. In an aspect, the receiver component 150 may include a demodulator 152, a deinterleaver 154, a deprioritizer 156, and a decoder 158.

The demodulator 152 may receive one or more modulation symbols and determine a most likely set of bits based on each received modulation symbol. As discussed above, there is a chance of one or more errors when demodulating the received modulation symbols. However, errors in the MSB are less likely than errors in the LSB. The demodulator 152 may generate a stream of bits based on the order of the modulation symbols.

The deinterleaver 154 may perform the inverse operation to the interleaver 178. The deinterleaver 154 may also operate at the bit level, symbol level, or sub-carrier level. The deinterleaver 154 may output a stream of prioritized bits.

The deprioritizer 156 may perform the inverse operation to the prioritizer 176. For example, the deprioritizer 156 may reorder the encoded bits into the order originally produced by the encoder 172. In an aspect, the deprioritizer 156 may reorder the bits based on a selected coding scheme 174 and a coding rate. The deprioritizer 156 may obtain the selected coding scheme 174 and coding rate from a control channel (e.g., based on a transmit format combination indicator (TFCI), downlink control information (DCI), upper layer signaling, or another indication). The deprioritizer 156 may use a look up table or formula to map the encoded bits to the original order.

The decoder 158 may decode the encoded bits to obtain the original code block. The decoder 158 may decode the encoded bits based on the selected coding scheme 174 and code rate. The decoder 158 may also determine whether the code block was correctly decoded. For example, the decoder 158 may perform a cyclic redundancy check to determine whether the code block was decoded correctly.

Referring to FIG. 2, an example signal constellation 200 for 256-QAM shows the mapping of each 8-bit value to a constellation point. The decimal representations of the values is shown for convenience. The signal constellation is arranged in relation to an in-phase (I) axis 210 and a quadrature (Q) axis 220. The two most significant bits of each constellation point in the same quadrant are the same. For example, the value 46 (00101110) is near the value 62 (00111110) in the first quadrant, whereas the value 68 (01000100) is in the second quadrant. Accordingly, if a received symbol experiences interference and is interpreted as another point in the same quadrant, the most significant bits are less likely to change than less significant bits.

Figure 3:
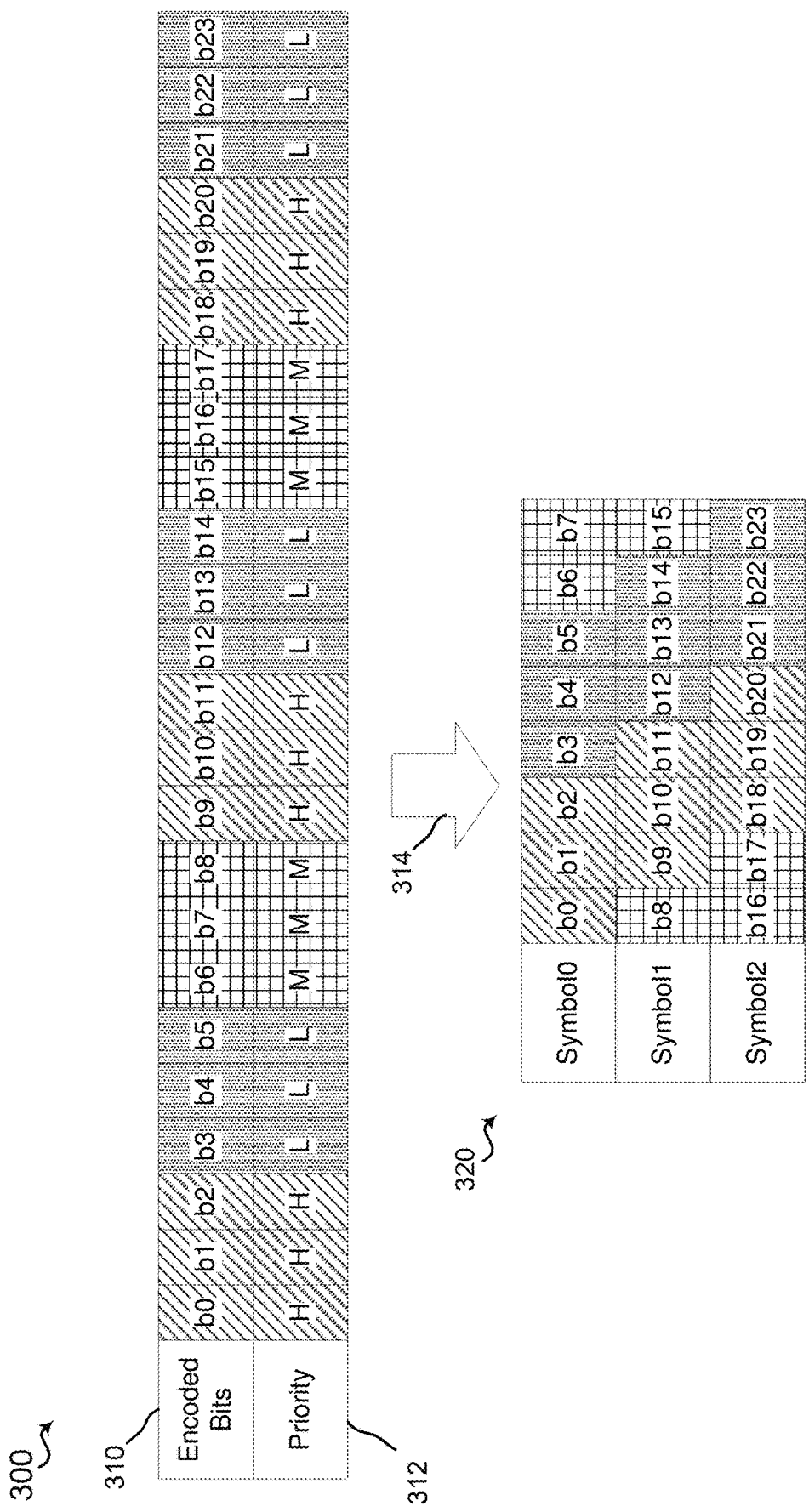
FIG. 3 is an example sequential mapping of encoded bits to modulation symbols.

Referring to FIG. 3, an example mapping 300 maps encoded bits 310 without regard to a priority 312. For example, the encoded bits 310 are output from the encoder 172 in sequential order where $b_i$ represents the $i^{th}$ bit. The coding scheme may be, for example, a LDPC code that produces systematic bits, first degree parity bits, and second degree parity bits. The systematic bits may be assigned a high priority (H), the second degree parity bits may be assigned a medium priority (M), and the first degree parity bits may be assigned a low priority (L). The high priority bits may have a higher relative priority than the medium priority bits, and the medium priority bits may have a higher relative priority than the low priority bits. For purposes of illustration, the output of the encoder 172 is illustrated as outputting bits in groups of three. It should be appreciated that other groups and orders of bits may be output by the encoder 172 based on the specific encoding scheme and code rate. A mapping operation 314 may sequentially map the encoded bits 310 to the bits of the symbols 320. Such a sequential mapping may be referred to as a baseline mapping. The symbols 320 may be, for example, 256-QAM symbols representing 8 bits. As illustrated symbol0, for example, may include bits {b0, b1, b2, b3, b4, b5, b6, b7}. As illustrated the three most significant bits of symbol0 are high priority bits, followed by three low priority bits, then two medium priority bits. Accordingly, while the high priority bits are less likely to experience errors than the low priority bits, the medium priority bits are more likely to experience errors than the low priority bits due to the location of the medium priority bits in the least significant locations. As illustrated in symbol1 and symbol2, the mapping operation 314 results in medium priority bits being placed in the MSB and high priority bits having less significance. Accordingly, the high priority bits may experience higher error rates than the medium priority bits. A person skilled in the art should appreciate that if the mapping operation 314 were to be applied to a longer stream of bits, in some symbols, low priority bits may be mapped to the MSB while the high priority bits may be mapped to the LSB.

Figure 4:
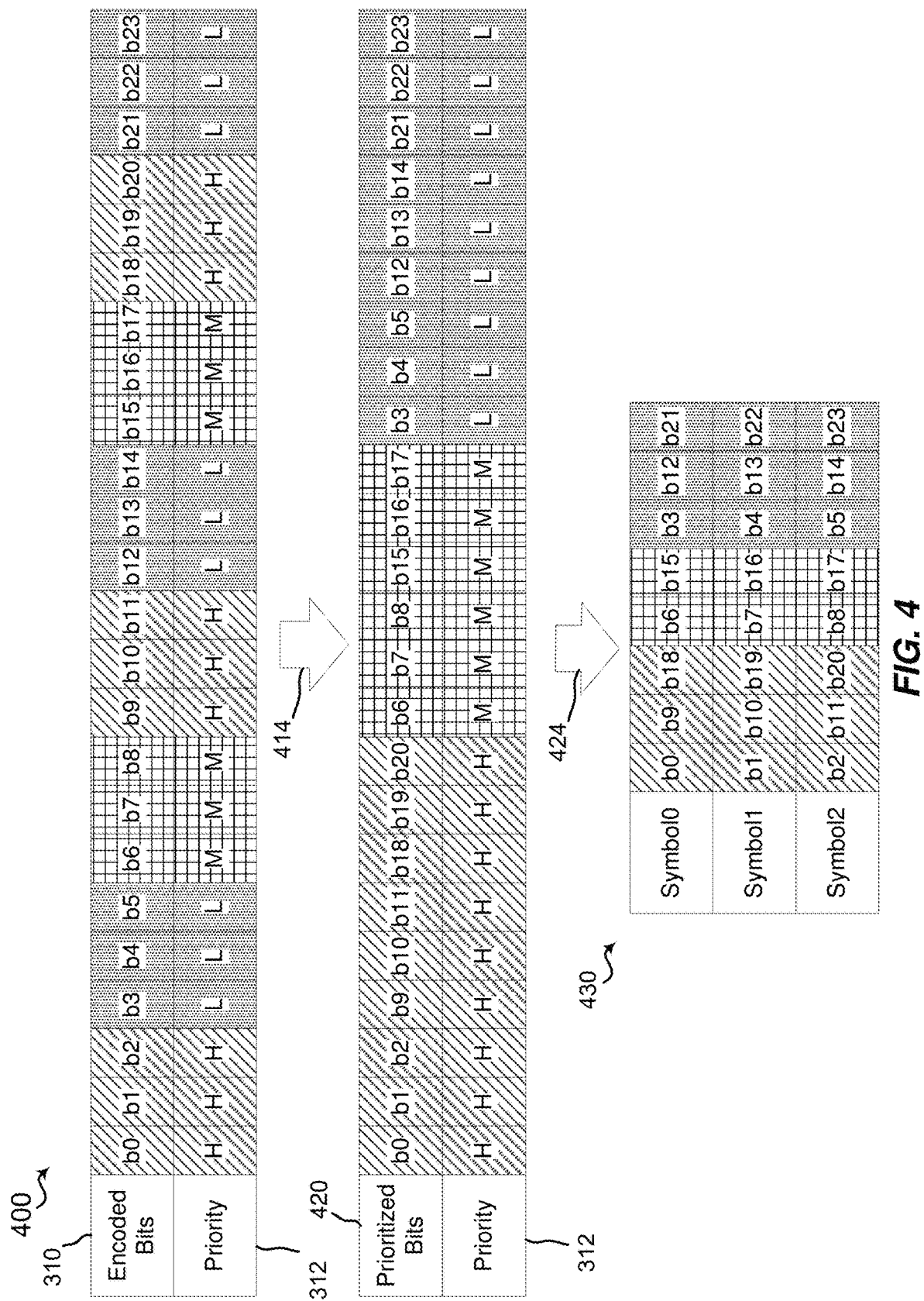
FIG. 4 is an example prioritized mapping of encoded bits to modulation symbols according to an aspect of the disclosure.

Referring to FIG. 4, an example mapping 400 maps encoded bits 410 based on the priority 412. A reordering operation 414 may be performed by the prioritizer 176. The reordering operation 414 may reorder the bits such that the prioritized bits 420 includes all of the high priority bits first, followed by all of the medium priority bits, then the low priority bits. In a mapping operation 424, instead of mapping the bits sequentially within each symbol, the prioritizer 176 may map the bits sequentially to the most significant bit available based on the number of symbols. For example, the first bit (b0) in the prioritized bits 420 may be mapped to the MSB of symbol0, the second bit (b1) may be mapped to the MSB of symbol1, and the third bit (b2) to symbol2. Assuming there are only three symbols, the fourth bit (b9) of the prioritized bits may be mapped to the second bit of symbol0, the fifth bit (b10) may be mapped to the second bit of symbol1, and so on. As illustrated, the reordering operation 414 and the mapping operation 424 result in each symbol having the high priority bits located in the most significant locations and the low priority bits located in the least significant locations with the medium priority bits in between.

Figure 5:
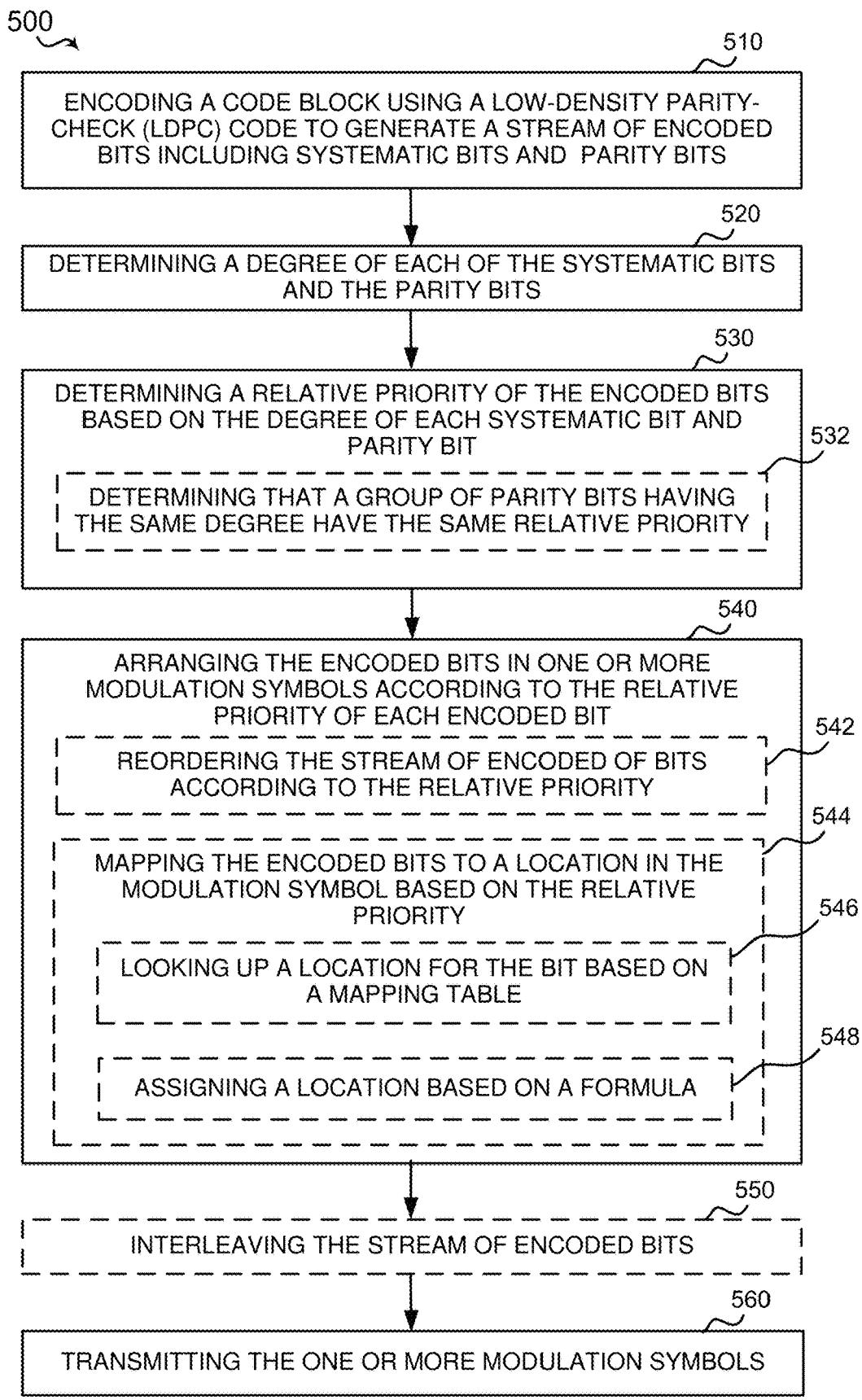
FIG. 5 is a flow diagram of an example method of transmitting encoded bits mapped to symbols based on relative priority.

Referring to FIG. 5, a method 500 of wireless communication in operating a transmitting device (e.g., base station 105 in a downlink direction or a UE 110 in an uplink direction) according to the above-described aspects to prioritize encoded bits includes one or more of the herein-defined actions. Blocks shown in dashed lines may be optional.

In an aspect, at block 510, method 500 includes encoding a code block using a low-density parity-check (LDPC) code to generate a stream of encoded bits including systematic bits and parity bits. For instance, in an aspect, the base station 105 or the UE 110 may execute the encoder 172 of transmitter component 170 to encode the code block using the LDPC code to generate a stream of encoded bits, as described herein. For example, the encoder 172 may use a LDPC coding scheme 174 to encode the code block to generate the stream of encoded bits 310 including systematic bits and parity bits. The stream of encoded bits 310 may include multiple degrees of parity bits. For example, the LDPC coding scheme 174 may produce at least two different degrees for systematic and parity bits. The LDPC coding scheme 174 may be known to a receiver, for example, by being preconfigured (e.g., defined in a standard) or signaled (e.g., via a control channel or higher layer signaling).

At block 520, the method 500 may include determining a degree of each of the systematic bits and parity bits. In an aspect, for example, the base station 105 or the UE 110 may execute the prioritizer 176 to determine the degree of each of the systematic bits and parity bits based on the LDPC coding scheme 174 and/or the size of the code block. For instance, the LDPC coding scheme 174 may output the encoded bits in a specific order based on the size of the code block, so the prioritizer 176 may determine the degree of each systematic bit and parity bit based on the order of output from the encoder 172.

At block 530, the method 500 may include determining the relative priority of each bit of the stream of encoded bits. For instance, in an aspect, the base station 105 or UE 110 may execute the prioritizer 176 to determine the relative priority of each bit of the stream of encoded bits. When using an LDPC code, the priority may be based on the degree of the systematic bits and parity bits. In some cases, high degree parity bits may have higher priority than systematic bits. The exact priority may be determined using simulations and/or EXIT charts analysis. In an aspect, in sub-block 532, the method 500 may optionally include determining that each bit of a group of parity bits having the same degree has the same relative priority. For example, the prioritizer 176 may determine that parity bits having the same degree have the same priority relative to each other, but have a different priority relative to systematic bits or parity bits of a different degree.

At block 540, the method 500 may include arranging the encoded bits in one or more modulation symbols according to the relative priority of each encoded bit. For instance, in an aspect, the base station 105 or the UE 110 may execute the prioritizer 176 to arrange the encoded bits 310 in one or more modulation symbols 320 according to a relative priority 312 of each encoded bit. In an aspect, in sub-block 542, the block 540 may optionally include reordering the stream of bits according to the relative priority. For example, the prioritizer 176 may arrange higher priority bits first in the stream with lower priority bits at the end. In sub-block 544, the block 540 may optionally include mapping the encoded bits to a location in the modulation symbol based on the relative priority. For example, the prioritizer 176 may map each encoded bit to the respective location in the modulation symbol based on the relative priority. In sub-block 546, mapping the encoded bits may optionally include looking up a location for the bit based on a mapping table, which may be stored in a memory of the base station 105 or the UE 110, or within the prioritizer 176 . . . . The mapping table may be used by the prioritizer to map bits directly from the output of the encoder, or from a reordered stream of bits. The mapping table may be configured in the prioritizer 176. In sub-block 548, mapping the encoded bits may optionally include assigning a location based on a formula. For example, the prioritizer 176 may be configured with a formula (e.g., programmed to implement a formula) to assign a location for each encoded bit. If the bits are in order of priority (e.g., prioritized bits 420), formula 1 above, may be used to map the bits to locations within the symbols 430. More complex formulas may be used if the encoded bits 310 are not in order of priority.

At block 550, the method 500 may optionally include interleaving the stream of encoded bits after reordering the encoded bits. For instance, in an aspect, the base station 105 or the UE 110 may execute the interleaver 178 to interleave the stream of encoded bits. In an aspect, the interleaving may be performed after reordering the encoded bits (e.g., after sub-block 532).

At block 560, the method 500 may include transmitting the one or more modulation symbols. In an aspect, for example, the base station 105 or the UE 110 may execute the transmitter component 170 to transmit the one or more modulation symbols. For example, the transmitter component 170 may wirelessly transmit the modulation symbols via the transceiver 702 and RF front end 788 (FIG. 7) or the transceiver 802 and RF front end 888 (FIG. 8).

Figure 6:
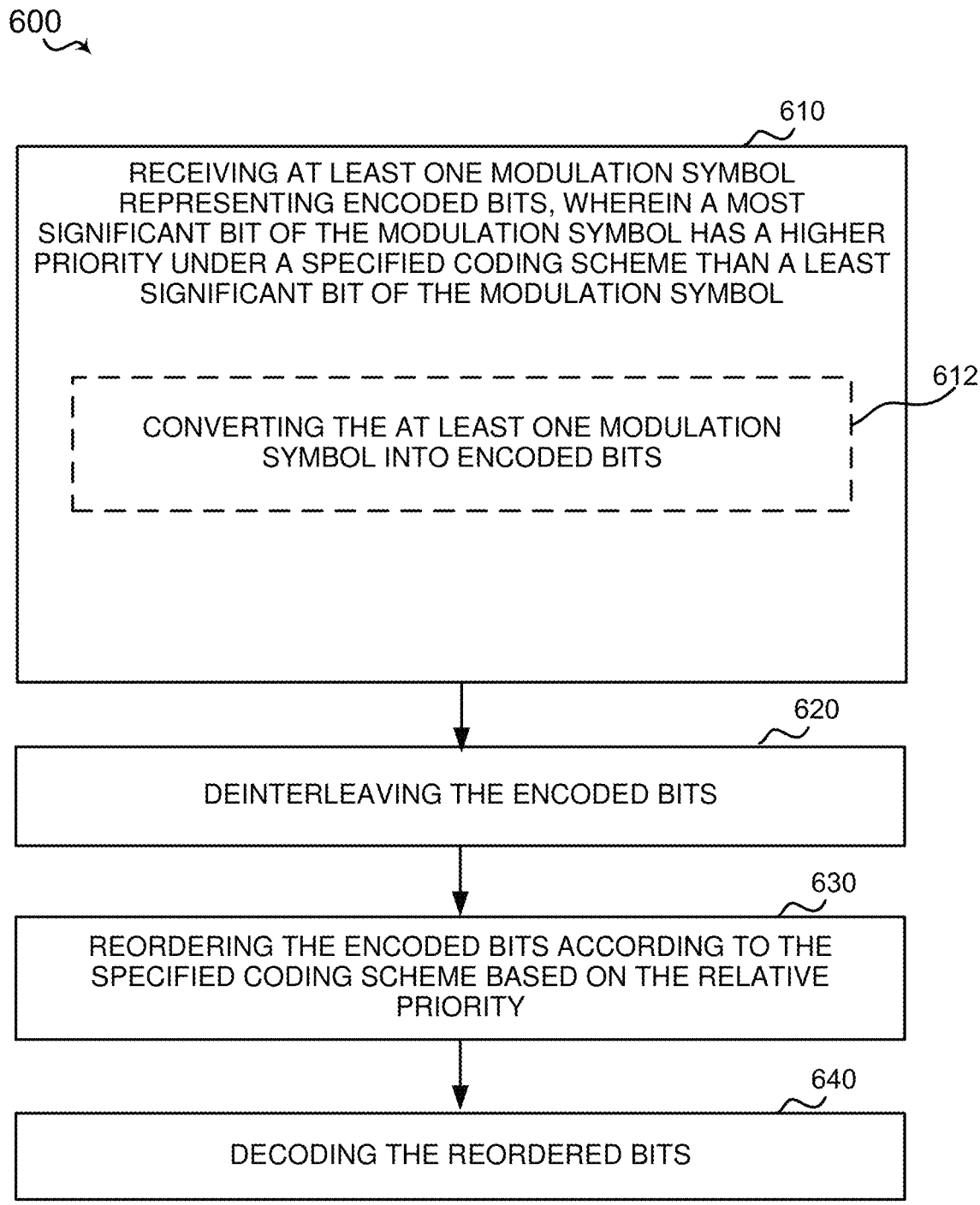
FIG. 6 is a flow diagram of an example of a method of receiving encoded bits mapped to symbols based on relative priority.

Referring to FIG. 6, a method 600 of wireless communication in operating a receiving device (e.g., base station 105 in an uplink direction or UE 110 in a downlink direction) according to the above-described aspects to receive prioritized encoded bits includes one or more of the herein-defined actions.

For example, at block 610, the method 600 includes receiving at least one modulation symbol representing encoded bits. For instance, in an aspect, the base station 105 or the UE 110 may execute the receiver component 150 to receive at least one modulation symbol representing encoded bits, as described herein. A most significant bit of the modulation symbol may have a higher priority under a specified coding scheme than a least significant bit of the modulation symbol. In an aspect, at sub-block 612, the block 610 may optionally include converting the at least one modulations symbol into encoded bits. For example, the base station 105 or the UE 110 may execute the demodulator 152 to convert a modulation symbol to the corresponding encoded bits. The demodulator 152 may demodulate multiple symbols and arrange the encoded bits into a stream.

At block 620, the method 600 may optionally include deinterleaving the encoded bits. For instance, in an aspect, the base station 105 or the UE 110 may execute the deinterleaver 154 to deinterleave the encoded bits. The deinterleaver 154 may deinterleave the bits when the interleaver 178 was used at the transmitter component 170, which may be signaled by a control channel or higher layer signaling.

At block 630, the method 600 may include reordering the encoded bits according to the specified coding scheme based on the relative priority. For instance, in an aspect, the base station 105 or the UE 110 may execute the deprioritizer 156 to reorder the encoded bits according to the specified coding scheme based on the relative priority. For example, the deprioritizer 156 may use a look up table, which may be stored in a memory of the base station 105 or the UE 110, or a formula corresponding to a reordering process used by the prioritizer 176. The deprioritizer 156 may select from one or more pre-preconfigured reordering processes. The deprioritizer 156 may select a reordering process based on the received modulation symbol, a control channel, or higher layer signaling. For example, the selected reordering process may correspond to an indicated modulation and coding scheme used to generate the modulation symbol.

At block 640, the method 600 may include decoding the reordered bits. For instance, in an aspect, the base station 105 or the UE 110 may execute the decoder 158 to decode the reordered bits. The decoder 158 may decode the reordered bits using a coding scheme 174, which may be signaled by a control channel or higher layer signaling. The decoder 158 may execute a cyclic redundancy check to determine whether the decoding was successful.

Figure 7:
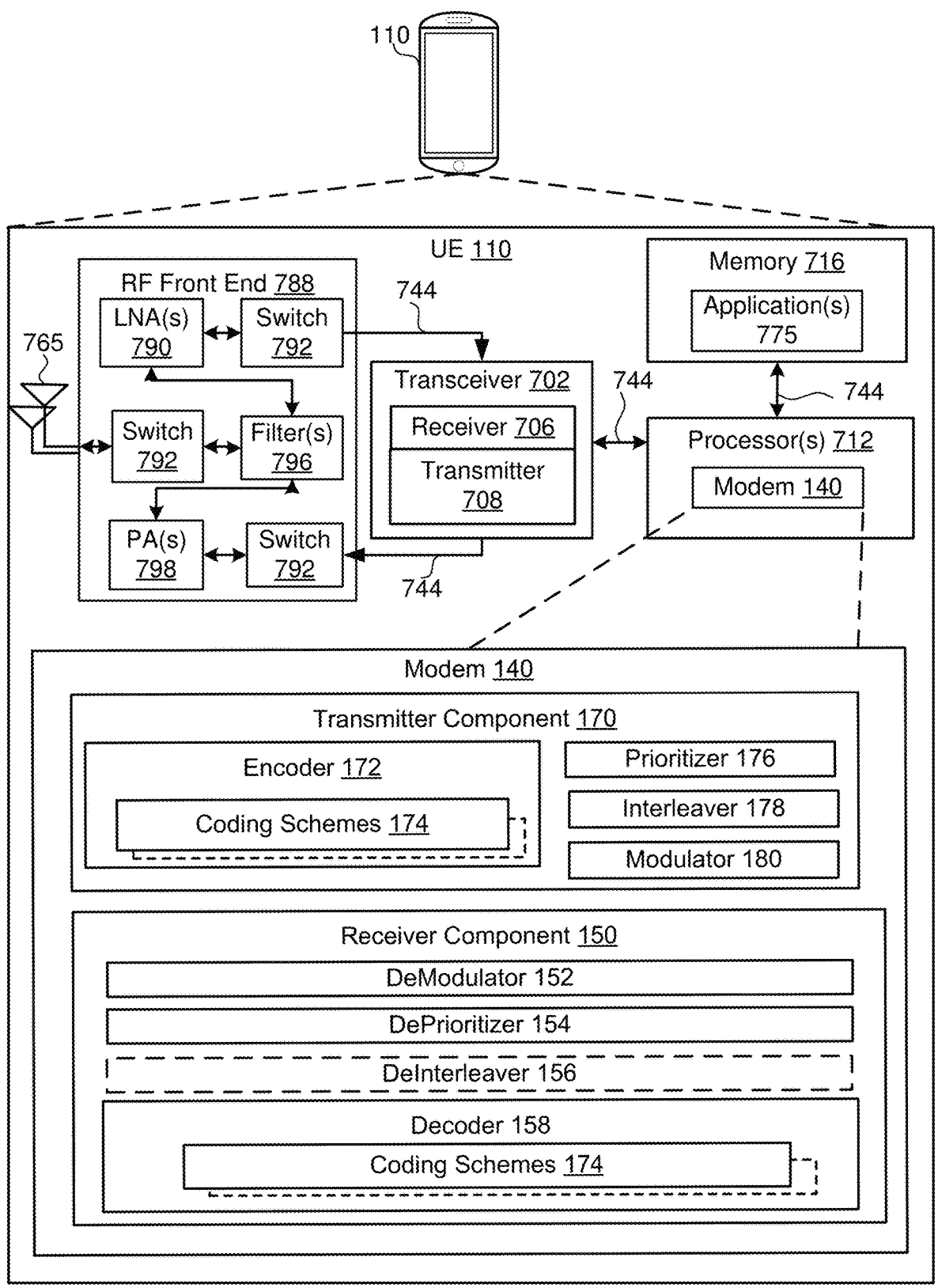
FIG. 7 is a schematic diagram of example components of the UE of FIG. 1.
Figure 8:
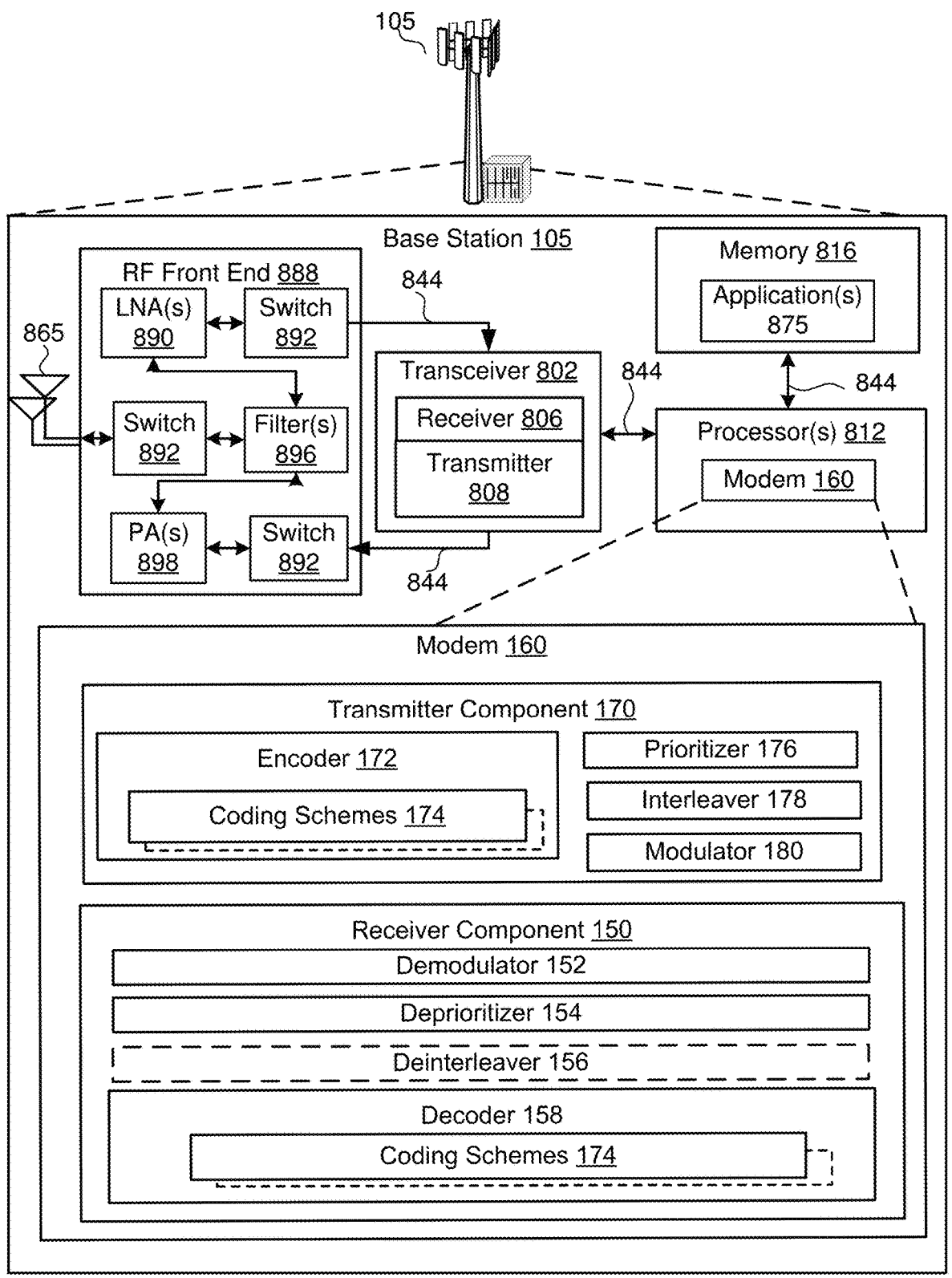
FIG. 8 is a schematic diagram of example components of the base station of FIG. 1.

Referring to FIG. 7, one example of an implementation of UE 110 may include a variety of components, some of which have already been described above, but including components such as one or more processors 712 and memory 716 and transceiver 702 in communication via one or more buses 744, which may operate in conjunction with modem 140, the transmitter component 170, and the receiver component 150 to enable one or more of the functions described herein related to prioritizing encoded bits within modulation symbols Further, the one or more processors 712, modem 714, memory 716, transceiver 702, RF front end 788 and one or more antennas 765, may be configured to support voice and/or data calls (simultaneously or non-simultaneously) in one or more radio access technologies.

In an aspect, the one or more processors 712 can include a modem 140 that uses one or more modem processors. The various functions related to the transmitter component 170 and the receiver component 150 may be included in modem 140 and/or processors 712 and, in an aspect, can be executed by a single processor, while in other aspects, different ones of the functions may be executed by a combination of two or more different processors. For example, in an aspect, the one or more processors 712 may include any one or any combination of a modem processor, or a baseband processor, or a digital signal processor, or a transmit processor, or a receiver processor, or a transceiver processor associated with transceiver 702. In other aspects, some of the features of the one or more processors 712 and/or modem 140 associated with transmitter component 170 and/or receiver component 150 may be performed by transceiver 702.

Also, memory 716 may be configured to store data used herein and/or local versions of applications 775, transmitter component 170, or receiver component 150 and/or one or more of its subcomponents being executed by at least one processor 712. Memory 716 can include any type of computer-readable medium usable by a computer or at least one processor 712, such as random access memory (RAM), read only memory (ROM), tapes, magnetic discs, optical discs, volatile memory, non-volatile memory, and any combination thereof. In an aspect, for example, memory 716 may be a non-transitory computer-readable storage medium that stores one or more computer-executable codes defining transmitter component 170 and receiver component 150 and/or one or more of its subcomponents, and/or data associated therewith, when UE 110 is operating at least one processor 712 to execute transmitter component 170 or receiver component 150 and/or one or more of their respective subcomponents.

Transceiver 702 may include at least one receiver 706 and at least one transmitter 708. Receiver 706 may include hardware, firmware, and/or software code executable by a processor for receiving data, the code comprising instructions and being stored in a memory (e.g., computer-readable medium). Receiver 706 may be, for example, a radio frequency (RF) receiver. In an aspect, receiver 706 may receive signals transmitted by at least one base station 105. Additionally, receiver 706 may process such received signals, and also may obtain measurements of the signals, such as, but not limited to, Ec/Io, SNR, RSRP, RSSI, etc. Transmitter 708 may include hardware, firmware, and/or software code executable by a processor for transmitting data, the code comprising instructions and being stored in a memory (e.g., computer-readable medium). A suitable example of transmitter 708 may including, but is not limited to, an RF transmitter.

Moreover, in an aspect, UE 110 may include RF front end 788, which may operate in communication with one or more antennas 765 and transceiver 702 for receiving and transmitting radio transmissions, for example, wireless communications transmitted by at least one base station 105 or wireless transmissions transmitted by UE 110. RF front end 788 may be connected to one or more antennas 765 and can include one or more low-noise amplifiers (LNAs) 790, one or more switches 792, one or more power amplifiers (PAs) 798, and one or more filters 796 for transmitting and receiving RF signals.

In an aspect, LNA 790 can amplify a received signal at a desired output level. In an aspect, each LNA 790 may have a specified minimum and maximum gain values. In an aspect, RF front end 788 may use one or more switches 792 to select a particular LNA 790 and its specified gain value based on a desired gain value for a particular application.

Further, for example, one or more PA(s) 798 may be used by RF front end 788 to amplify a signal for an RF output at a desired output power level. In an aspect, each PA 798 may have specified minimum and maximum gain values. In an aspect, RF front end 788 may use one or more switches 792 to select a particular PA 798 and its specified gain value based on a desired gain value for a particular application.

Also, for example, one or more filters 796 can be used by RF front end 788 to filter a received signal to obtain an input RF signal. Similarly, in an aspect, for example, a respective filter 796 can be used to filter an output from a respective PA 798 to produce an output signal for transmission. In an aspect, each filter 796 can be connected to a specific LNA 790 and/or PA 798. In an aspect, RF front end 788 can use one or more switches 792 to select a transmit or receive path using a specified filter 796, LNA 790, and/or PA 798, based on a configuration as specified by transceiver 702 and/or processor 712.

As such, transceiver 702 may be configured to transmit and receive wireless signals through one or more antennas 765 via RF front end 788. In an aspect, transceiver may be tuned to operate at specified frequencies such that UE 110 can communicate with, for example, one or more base stations 105 or one or more cells associated with one or more base stations 105. In an aspect, for example, modem 140 can configure transceiver 702 to operate at a specified frequency and power level based on the UE configuration of the UE 110 and the communication protocol used by modem 140.

In an aspect, modem 140 can be a multiband-multimode modem, which can process digital data and communicate with transceiver 702 such that the digital data is sent and received using transceiver 702. In an aspect, modem 140 can be multiband and be configured to support multiple frequency bands for a specific communications protocol. In an aspect, modem 140 can be multimode and be configured to support multiple operating networks and communications protocols. In an aspect, modem 140 can control one or more components of UE 110 (e.g., RF front end 788, transceiver 702) to enable transmission and/or reception of signals from the network based on a specified modem configuration. In an aspect, the modem configuration can be based on the mode of the modem and the frequency band in use. In another aspect, the modem configuration can be based on UE configuration information associated with UE 110 as provided by the network during cell selection and/or cell reselection.

Referring to FIG. 8 one example of an implementation of base station 105 may include a variety of components, some of which have already been described above, but including components such as one or more processors 812 and memory 816 and transceiver 802 in communication via one or more buses 844, which may operate in conjunction with modem 160, transmitter component 170, and receiver component 150 to enable one or more of the functions described herein related to prioritization of encoded bits within modulation symbols.

The transceiver 802, receiver 806, transmitter 808, one or more processors 812, memory 816, applications 875, buses 844, RF front end 888, LNAs 890, switches 892, filters 896, PAs 898, and one or more antennas 865 may be the same as or similar to the corresponding components of UE 110, as described above, but configured or otherwise programmed for base station operations as opposed to UE operations. In an aspect, the base station 105 may perform both transmission according to method 500 and reception according to method 600.

The above detailed description set forth above in connection with the appended drawings describes examples and does not represent the only examples that may be implemented or that are within the scope of the claims. The term "example," when used in this description, means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, computer-executable code or instructions stored on a computer-readable medium, or any combination thereof.

The various illustrative blocks and components described in connection with the disclosure herein may be implemented or performed with a specially-programmed device, such as but not limited to a processor, a digital signal processor (DSP), an ASIC, a FPGA or other programmable logic device, a discrete gate or transistor logic, a discrete hardware component, or any combination thereof designed to perform the functions described herein. A specially-programmed processor may be a microprocessor, but in the alternative, the processor may be any conventional processor, controller, microcontroller, or state machine. A specially-programmed processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a non-transitory computer-readable medium. Other examples and implementations are within the scope and spirit of the disclosure and appended claims. For example, due to the nature of software, functions described above can be implemented using software executed by a specially programmed processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the common principles defined herein may be applied to other variations without departing from the spirit or scope of the disclosure. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise. Thus, the disclosure is not to be limited to the examples and designs described herein but is to be accorded the widest scope consistent with the principles and novel features disclosed herein.

What is claimed is:

1. A method of wireless communications, comprising:
    encoding a code block using a low-density parity-check (LDPC) code to generate a stream of encoded bits including systematic bits and parity bits;
    arranging the encoded bits in a group of two or more modulation symbols, wherein arranging the encoded bits comprises mapping each encoded bit to a location within the group of two or more modulation symbols, wherein the mapping comprises, for each encoded bit, assigning the location for that encoded bit to a bit location in a symbol selected among all symbols of the group of two or more modulation symbols such that the systematic bits are mapped to one or more most significant bit positions of the group of two or more modulation symbols,
        wherein the assigning the location of each encoded bit comprises first selecting the symbol of the group of two or more modulation symbols that has a bit location that is in a most significant bit position that is available among all symbols of the group of two or more modulation symbols, and second selecting as the location of that encoded bit a most significant bit location that is available within that selected symbol; and
    transmitting the one or more modulation symbols.

2. The method of claim 1, wherein the arranging comprises reordering the stream of encoded bits according to a relative priority of each encoded bit based on a degree of that encoded bit.

3. The method of claim 2, further comprising interleaving the stream of encoded bits after reordering the encoded bits.

4. The method of claim 2, wherein arranging the encoded bits comprises mapping the encoded bits to a location in the one or more modulation symbols based on a relative priority.

5. The method of claim 4, wherein higher priority bits are located in a most significant bit of each of the one or more modulation symbols.

6. The method of claim 4, wherein lower priority bits are located in a least significant bit of each of the one or more modulation symbols.

7. The method of claim 4, wherein the mapping comprises looking up the location for each bit based on a mapping table.

8. The method of claim 2, further comprising determining the relative priority of the systematic bits and the parity bits based on an encoding scheme of the LDPC code.

9. The method of claim 2, wherein the systematic bits and parity bits are grouped by degree, and wherein determining the relative priority comprises determining that each bit of a group of systematic bits or a group of parity bits having the same degree has the same relative priority.

10. An apparatus, comprising:
    one or more memories; and
    one or more processors in communication with the memory, wherein the one or more processors is configured to:

encode a code block using a low-density parity-check (LDPC) code to generate a stream of encoded bits including systematic bits and parity bits;

arrange the encoded bits in a group of two or more modulation symbols, wherein arranging the encoded bits comprises mapping each encoded bit to a location within the group of two or more modulation symbols, wherein the mapping comprises, for each encoded bit, assigning the location for that encoded bit to a bit location in a symbol selected among all symbols of the group of two or more modulation symbols such that the systematic bits are mapped to one or more most significant bit positions of the group of two or more modulation symbols, wherein the assigning the location of each encoded bit comprises first selecting the symbol of the group of two or more modulation symbols that has a bit location that is in a most significant bit position that is available among all symbols of the group of two or more modulation symbols, and second selecting as the location of that encoded bit a most significant bit location that is available within that selected symbol; and transmit the one or more modulation symbols.

11. The apparatus of claim 10, wherein the one or more processors are configured to reorder the stream of encoded bits according to a relative priority of each encoded bit based on a degree of that encoded bit.

12. The apparatus of claim 11, wherein the one or more processors are further configured to interleave the stream of encoded bits after reordering the encoded bits.

13. The apparatus of claim 11, wherein the one or more processors are configured to map each bit of the encoded bits to a location in the one or more modulation symbols based on the relative priority.

14. The apparatus of claim 13, wherein higher priority bits are located in a most significant bit of each of the one or more modulation symbols.

15. The apparatus of claim 13, wherein lower priority bits are located in a least significant bit of each of the one or more modulation symbols.

16. The apparatus of claim 13, wherein the one or more processors are configured to look up the location for each encoded bit based on a mapping table.

17. The apparatus of claim 11, wherein the one or more processors are configured to determine the relative priority of the systematic bits and the parity bits based on an encoding scheme of the LDPC code.

18. The apparatus of claim 11, wherein the parity bits are grouped by degree, and wherein the processor is configured to determine that each bit of a group of systematic bits or a group of parity bits having the same degree has the same relative priority.

19. A computer-readable non-transitory medium storing computer code executable by one or more processors for wireless communications, comprising one or more codes executable to:

encode a code block using a low-density parity-check (LDPC) code to generate a stream of encoded bits including systematic bits and parity bits;

arrange the encoded bits in a group of two or more modulation symbols according to the relative priority of each encoded bit, wherein arranging the encoded bits comprises mapping each encoded bit to a location within the group of two or more modulation symbols, wherein the mapping comprises, for each encoded bit, assigning the location for that encoded bit to a bit location in a symbol selected among all symbols of the group of two or more modulation symbols such that the systematic bits are mapped to one or more most significant bit positions of the group of two or more modulation symbols, wherein the assigning the location of each encoded bit comprises first selecting the symbol of the group of two or more modulation symbols that has a bit location that is in a most significant bit position that is available among all symbols of the group of two or more modulation symbols, and second selecting as the location of that encoded bit a most significant bit location that is available within that selected symbol; and transmit the one or more modulation symbols.

* * * * *